(12) United States Patent
Maltabes et al.

(10) Patent No.: US 6,744,494 B2
(45) Date of Patent: Jun. 1, 2004

(54) CONTINUOUSLY ADJUSTABLE NEUTRAL DENSITY AREA FILTER

(75) Inventors: John Maltabes, Austin, TX (US); Karl Mautz, Round Rock, TX (US); Alain Charles, Maplewoods (SG)

(73) Assignee: Motorola, Inc., Schaumburg, IL (US)

( * ) Notice: Subject to any disclaimer, the term of this patent is extended or adjusted under 35 U.S.C. 154(b) by 216 days.

(21) Appl. No.: 10/012,989

(22) Filed: Dec. 7, 2001

(65) Prior Publication Data

US 2003/0107720 A1 Jun. 12, 2003

(51) Int. Cl.[7] ............................. G03B 27/72; G03B 27/42
(52) U.S. Cl. ............................................ 355/71; 355/53
(58) Field of Search ........................... 355/53, 67, 71; 430/5, 30, 396

(56) References Cited

U.S. PATENT DOCUMENTS 5,437,946 A  *  8/1995  McCoy ........................... 430/5
6,013,401 A     1/2000  McCullough et al.

FOREIGN PATENT DOCUMENTS

| EP | 1 291 721 A1 | 3/2003 |
| EP | 1 292 721 A1 | 3/2003 |
| JP | 61-104622 | 5/1986 |
| JP | 61104622 | 5/1986 |
| JP | 04-080760 | 3/1992 |
| JP | 04080760 | 3/1992 |
| JP | 05190444 | 7/1993 |
| JP | 05-190444 | 7/1993 |
| JP | 11219893 | 8/1999 |
| JP | 11-219893 | 8/1999 |

OTHER PUBLICATIONS

PCT/US02/36836 PCT Search Report mailed Apr. 11, 2003.
International Search Report PCT/US02/36836.

* cited by examiner

Primary Examiner—Alan Mathews
(74) Attorney, Agent, or Firm—Robert L. King

(57) ABSTRACT

An apparatus for compensating light exposure on different, subsequently irradiated target areas (11, 12) in a photosensitive medium (2) on a semiconductor wafer (1). In order to improve exposure dose uniformity the apparatus comprises a mask filter (9) with a plurality of oblong transparent (31) and oblong opaque elements (32; 41) inserted between a light source (3) and said photosensitive medium (2) so that light (4) traverses through said plurality of transparent elements (31) to expose the photosensitive medium. Each of said plurality of oblong opaque elements (32; 41) is rotatable around a longitudinal axis (42) so as to define the area masked by the projection of the opaque element on the photosensitive medium and to continuously adjust a ratio between irradiated and non-irradiated areas on the photosensitive medium.

8 Claims, 2 Drawing Sheets

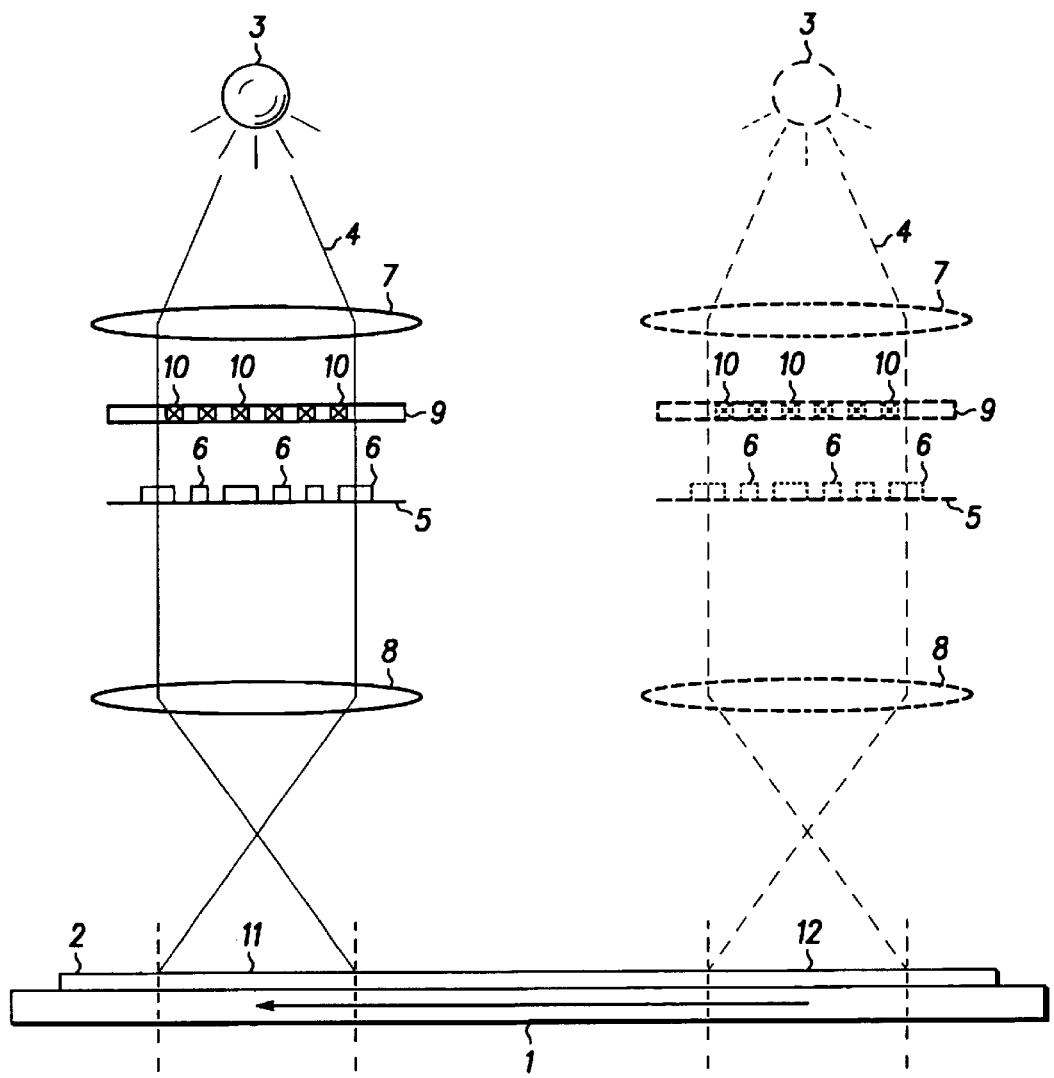
*- PRIOR ART -* FIG. 1
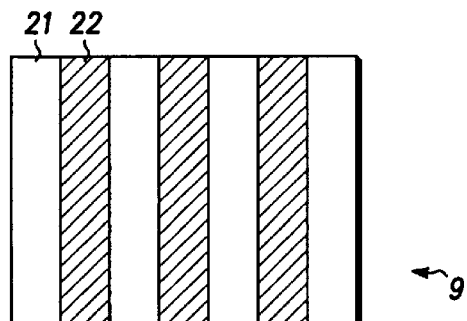
FIG. 2A
*- PRIOR ART -*
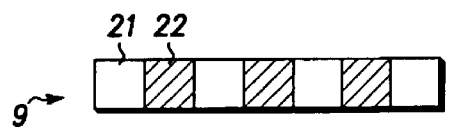
*- PRIOR ART -*
FIG. 2B

CONTINUOUSLY ADJUSTABLE NEUTRAL DENSITY AREA FILTER

FIELD OF THE INVENTION

The present invention generally relates to dose control in continuous wave and excimer laser based lithography tools.

BACKGROUND OF THE INVENTION

Typically, semiconductors wafers in integrated circuit fabrication are exposed to irradiation of a light source in an exposure tool. In the exposure tool the irradiation light passes through an optical column with optical elements such as spherical and aspheric collimator lenses and blinds. After the optical column the light traverses a reticle with device patterns on it and the device patterns are projected onto a wafer below. The wafer is covered by a photoresist. The chemical composition of the photoresist is changed by the irradiation with light and a latent image is formed in the photoresist. After irradiation of a first target area either the wafer is moved from a first position to a second position with the optical column being fixed or the optical column is moved from a first position to a second position with the wafer being fixed, and a second target area on the wafer is irradiated. Finally, the wafer is moved to another tool where the photoresist is developed and partly removed so as to form a protection layer including windows on the wafer. The protection layer corresponds to the device pattern on the reticle, and etchants react with the semiconductor wafer or ions are implanted into the semiconductor wafer through the windows of the protection layer.

The light source in the exposure tool may be a pulsed light source or a continuous wave light source. In case of a pulsed light source typically multiple pulses are necessary to form a complete projection of the device pattern in the photoresist layer on the semiconductor wafer. For instance, a single laser pulse 301 may have a free running output of approximately 250–300 millijoules (mJ) per pulse. However, only a very small portion of the output is used for exposure, namely a narrow band of frequency that may contain approximately 5% of the total energy of the light output of the laser.

Typically, the energy of the laser pulses varies. Since however the total amount of energy being absorbed by the photoresist must be the same in each irradiated target areas in order to ensure critical dimension (CD) uniformity, there are "averaging" means employed between the laser source and the wafer in order to obtain an exposure energy in the photoresist that is substantially equal for all target areas. As "averaging" means attenuator filters are used that reduce the power per pulse. For instance, 50 pulses are used to expose the photoresist in one target area. This is a greater number of pulses than is necessary for a complete exposure dose. However, running the exposure with more but less intensive laser pulses allows a dose control within 1% despite variations in energy output from pulse to pulse.

Pulse stability in the current version of deep ultraviolet (DUV) excimer lasers has improved significantly since their introduction. However the next generation lasers including argon fluoride (ArF) and fluoride (F2) lasers will have less pulse stability until this laser technology matures which is to be expected to be several device technology generations away. It would be time consuming and costly to change mask filters with each variation of the light source.

It is therefore desirable to provide a means that can easily be adapted to the varying requirements of averaging the pulse power of different light sources.

The present invention seeks to provide an optimized exposure tool which reduces the number of processing steps and complexity of the prior art.

BRIEF DESCRIPTION OF THE DRAWINGS

FIG. 1 illustrates schematically an optical column of a prior art lithography tool with a semiconductor wafer being irradiated;

FIGS. 2A and 2B each illustrate schematically a prior art mask element for reducing irradiation power in the photosensitive medium on the semiconductor wafer in a top view and in a side view, respectively;

DETAILED DESCRIPTION OF A PREFERRED EMBODIMENTS

Figure 3:
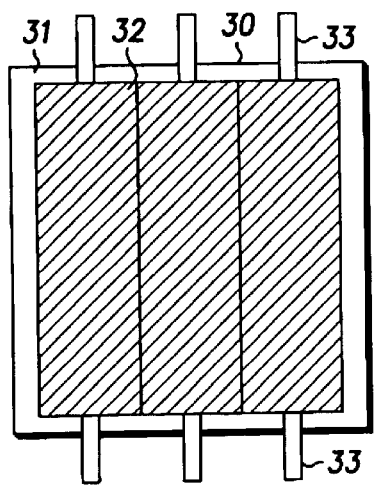
FIG. 3 shows an embodiment of the mask element according to the invention in a top view.

Generally the averaging means according to the invention is contained in the exposure tool after the beam delivery optics and the laser system and the lithography optics such as before the condenser for ease of design, or in any non-image plane prior to the projection optics. The mask filter is used to improve the uniformity of the exposure dose of different target areas on the photoresist (referred to as field-to-field exposure dose in the following) that is affected by pulse-to-pulse stability from the laser. Because of the variation in pulses, the mask filter according to the invention is used to reduce the intensity to require more pulses that averages out the pulse variability for consistent print replication. The minimum number of pulses is controlled to achieve this averaging. The desired dose (calculated from the number of pulses and filter reduction) is constant field-to-field but the number of pulses varies based on the pulse averaging calculation.

Also, this technique is apt to improve the pattern replication using fast resists that can exceed the scan stage speed limit, control and stability range. With fast resists too much energy is being delivered to the field resulting in loss of CD control. Correspondingly throughput must be reduced by using a less fast resist. For CD sensitive layers, stage synchronization (wafer and reticle stages of a scanner) is critical. Having the ability to moderate the light intensity to optimize the stage speeds is a major advantage of the mask filter according to the invention. The throughput can be optimized to achieve the highest possible while maintaining the averaging needed to ensure uniformity. In other words, throughput can be improved due to the lithography tool having an additional degree of control. This technique can be applied to I-line tools or other optical equipment such as telescopes, or other photon counting devices.

The details of the invention will be understood from the following description of embodiments and application examples with reference being made to the attached drawings. The figures are not to scale. Elements with the same purpose and effect are referred to by identical reference numerals.

Referring to FIG. 1, according to a first example of an exposure tool optical column a semiconductor wafer 1 with a photosensitive medium 2 on it is exposed to illumination light from a light source 3. The light 4 from the light source 3 passes through a reticle 5 with device patterns 6 on it. The patterns 6 on the reticle 5 are projected onto said photoresist 2 and form a latent image in the photoresist 2. The latent image is developed and processed so as to form a protection layer for subsequent etching and/or ion implantation steps.

A beam delivery optics 7 (indicated by a single focusing lens) is used to project light 4 from the light source 3 on the reticle 5. Light emerging from the reticle 5 is focused by a projection optics 8 (indicated by a single focusing lens) on the photoresist 2. In order to allow for the limited pulse-to-pulse stability of the laser pulses there is a mask filter 9 disposed e.g. between the beam delivery optics 7 and the reticle 5. Apart from transparent sections the mask filter 9 comprises absorbing or scattering mask elements 10. The density of the scattering mask elements 10 determines the ratio of transparency and opaqueness of the mask filter 9. FIG. 2A shows an example of the distribution of opaque and transparent elements of such mask filter 9 in top view. A typical mask filter 9 is fabricated from a transparent material (such as glass or quartz), sometimes referred to as a mask substrate. Apart from transparent sections 21 there are light absorbing elements (light absorbers) 22 disposed on the mask filter 9 to absorb and/or scatter light out of its original direction. In the conventional mask filter in FIG. 2A the shape of the opaque elements 22 in the plane of the mask filter 9 (that is substantially perpendicular to the light beam) is that of a longitudinal rectangle. Differently shaped elements 22 may be used as well, but they will not be considered here since the actual shape of the opaque elements is not relevant for the understanding of the invention. The horizontal dimension of the opaque elements 22 is generally chosen so that no (core) shadow is caused behind the opaque element 22 in the plane of the reticle 5. In other words, the width of the opaque elements 22 and of the transparent sections 21 there between is small enough for reducing light intensity without formation of (core) shadows on the reticle 5 and on further optical elements there under.

In FIG. 2B the mask filter of FIG. 2A is shown in a side view. As can be seen the vertical dimension of the opaque elements 10 of the mask filter 9 generally corresponds to the thickness of the substrate. (However, the dimensions in FIGS. 2A and 2B are greatly exaggerated.)

Referring back to FIG. 1, specifically only a single target area 11 of the photoresist 2 is irradiated at a time by the optical column. Since usually a single semiconductor wafer 1 contains a plurality of identical chips the wafer 1 is moved after a first irradiation from a first position to a second position where it is irradiated a second time. (As was noted above, instead the wafer may be fixed and the optical column is moved). The optical column in the first position of the wafer is shown in full lines on the left in FIG. 1. The optical column in the second position of the wafer is shown in dashed lines on the right in FIG. 1. The first target area on the photoresist 2 is referred to as 11, the second target area on the photoresist 2 is referred to as 12.

Uniformity of critical dimensions of integrated circuit (IC) features is necessary to achieve highest possible IC yield. One factor that affects the uniformity of the critical dimensions on the semiconductor wafer 1 is pulse-to-pulse power variation of light pulses. Currently one filter or a selection of filters in series has been used, that is insertable into a lamp optical path. The prior art filter (or filters in a series) has predefined fixed area opaque elements and it thus provides a predetermined blocking ratio of transmitted and obstructed light. If another blocking ratio is desired the filter has to be exchanged. This is time consuming and costly.

According to the invention there is provided a continuously adjustable mask filter of which one embodiment is shown in FIG. 3. The mask filter in FIG. 3 differs from the prior art filters in that the opaque elements are rotatably mounted in a frame 30 (indicated by a dashed lines rectangle). The frame 30 encompasses an open field with transparent sections 31 and opaque blinds 32. In the embodiment in FIG. 3 the shape of each of the blinds 32 is similar to that of the opaque elements in FIG. 2, namely it is the shape of a longitudinal rectangle, each blind being disposed with its edges in parallel to the sides of the frame 30.

Figure 4A:
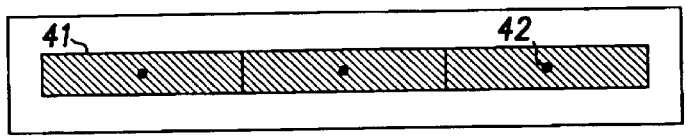
FIGS. 4A, 4B, and 4C show different settings of the mask element in FIG. 3 in a side view, respectively according to the invention.
Figure 4B:
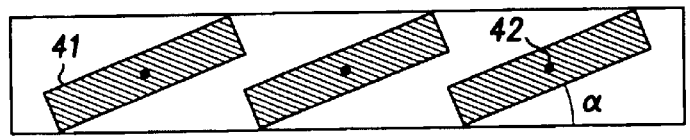
Figure 4C:
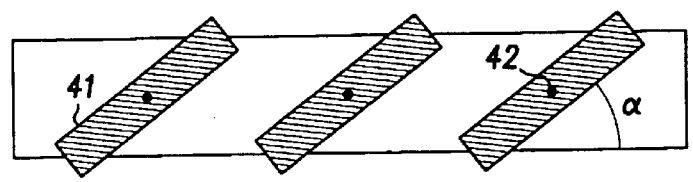
Figure 5:
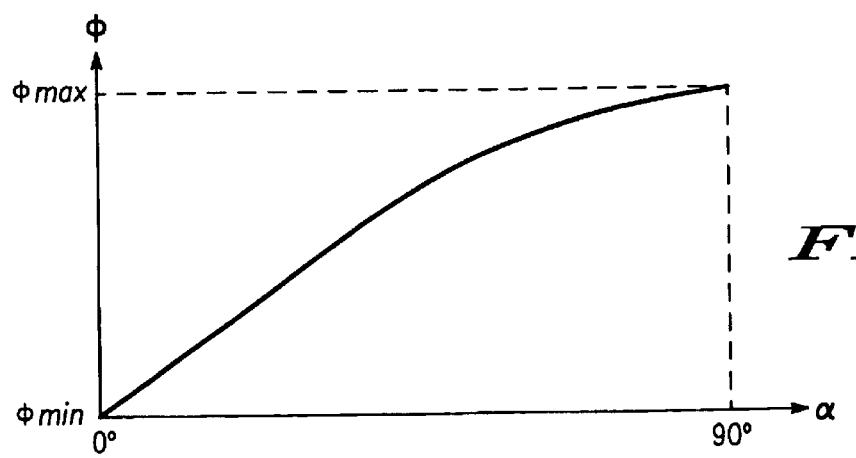
FIG. 5 shows the progression of the masked area of the photosensitive medium as a function of the setting in FIGS. 4A to 4C according to the invention.

Each of the opaque blinds 32 mounted rotatably in the frame 30 comprises a rotation shaft 33 that extends along a longitudinal axis of the blind 32 beyond the frame 30. Preferably, the rotation shafts 33 of all of the blinds 32 of one frame 30 are connected with each other and with a driving means (not shown). With the driving means the blinds can be rotated around their respective rotation shaft into a desired position, each position corresponding to a distinct setting of the mask filter. Three different settings of the mask filter according to the invention are shown in FIG. 4A, 4B, and 4C. In FIG. 4A a first setting of the mask filter is depicted. Blinds 41 are mounted in a frame 40 and are supported by their respective rotation shafts 42. In the first setting the blinds 41 are arranged in parallel to the filter plane. In FIG. 4B the blinds 41 are tilted and enclose an angle $\alpha$ with the plane of the mask filter frame 40. In FIG. 4C the blinds 41 are tilted further, and now they enclose an even greater angle $\alpha$ with the plane of the mask filter frame 40. The angle $\alpha$ is indicated in FIGS. 4B and 4C for illustrating the effect of a tilting operation. The rotation of the blinds 41 affects the projection area that is covered by the respective blind in a plane in-parallel to the filter mask below. (It will be apparent to the skilled person that the dimensions of the blinds in FIGS. 4A through 4C are greatly exaggerated and that the thickness of the blinds lies in the range of only parts of a millimeter, whereas the width of each of the blinds may be in the order of some millimeters.) The relation between the tilt angle $\alpha$ and the covered projection area in a plane below is given by a sine wave function, and this function is illustrated in FIG. 5. The vertical axis shows the "open" area of the frame 40 with no obstructions to traversing light, and this area is directly proportional to the irradiation dose $\Phi$ impinging on the semiconductor wafer 1 under the optical column. The horizontal axis corresponds to the tilt angle $\alpha$ and covers the range between 0° and 90°. As can be clearly seen the irradiated area is smallest with all blinds in parallel to the mask filter frame 40, namely the illumination is reduced to $\Phi$ min, being zero in FIG. 5. However, with increasing tilt angle $\alpha$ the illuminated area becomes degressively larger. It reaches its maximum $\Phi$ max at 90° with the complete area being substantially illuminated and no light being scattered or absorbed by the mask filter.

As a summary by inserting a continuously adjustable mask filter at an appropriate location in the optical path of the exposure tool the light attenuation can easily and immediately be adapted to actual requirements. In comparison current dose control in excimer based exposure tools with discrete neutral density filters alone or in combination provides stepwise control in exposure only that results in lower throughput or more laser pulses per exposure which both increase tool cost of ownership. The continuously variable neutral density filter according to the invention allows a constant scan speed or constant number of laser pulses to be used, thus maximizing throughput and laser lifetime providing the advantage that 1) laser lifetime is increased through minimum pulse number, 2) another way is provided to control dose in finer increments, and 3) scan speed is optimised for maximum throughput. This is achieved by: 1) a series of metal (such as stainless steel, chrome, or other noble metals) screen filters (blinds) in the light path, 2) adjusting—by some means—to vary metal screen pitch, width, and thickness that is controllable (such as cam and rotation for width change of metal screen lines at 90°), 3) possibly a tube located within the light path that has multiple filter densities within defined sections of it (such as quadrant, hexagonal or octagonal) that rotates into position to change density in stepwise progressions.

The invention is advantageously applicable to all newly designed lithography tools, and could be retrofit on existing tools, depending on their design and useful lifetime. It is an advantage of the invention that this modification can occur in existing tools or can be designed in by the supplier. Further the tool throughput is increased, the invention adds to laser chamber lifetime by running system with minimum pulses necessary to achieve pattern transfer, and the invention improves the cost of ownership (CoO) since the chamber is the most expensive consumable. This achieves dose control without producing optical errors such as chromic aberration. The mask filter design according to the invention is not subject to wear or exposure weakening that typically occurs in the membrane of film filters.

With a pulsed laser source, since the attenuation is continuously variable according to the invention, only a minimum number of laser pulses is necessary to achieve uniformity. With a continuous wave (e.g. lamp) source, one may start with a higher intensity source, attenuate it to the maximum allowable intensity that can be used in the system, and then reduce the attenuation according to the invention as the output from the lamp degrades over time.

While the invention has been described in terms of particular structures, devices and methods, those of skill in the art will understand based on the description herein that it is not limited merely to such examples and that the full scope of the invention is properly determined by the claims that follow.

REFERENCE NUMERALS 1 semiconductor wafer
2 photoresist layer on semiconductor wafer (photosensitive medium)
3 light source, laser system
4 illumination light
5 reticle, mask
6 reticle structure element
7 beam delivery optics
8 projection optics, lithography optics
9 mask filter
10 mask element
11 first irradiated area of photosensitive medium on wafer
12 second irradiated area of photosensitive medium on wafer
20 conventional filter element
21 transparent zone
22 opaque zone
30 frame
31 transparent element
32 opaque element
33 rotation shaft
40 frame, side wall
41 opaque element, side view
42 opaque element, rotation shaft axis $\alpha$ tilt angle of opaque element
$\Phi$ dose, $\Phi max$, $\Phi min$: extreme values of dose

What is claimed is:

1. A mask filter for compensating light exposure on different, subsequently irradiated target areas in a photosensitive medium on a semiconductor wafer to improve an exposure dose uniformity comprising:

a rectangular frame for insertion between a light source and said photosensitive medium, the rectangular frame having a transparent section around an interior perimeter of the rectangular frame;

a plurality of oblong rectangular opaque blinds positioned within the transparent section of the rectangular frame, each of the oblong rectangular opaque blinds having edges parallel to sides of the frame and being rotatably mounted in the frame;

a plurality of rotation shafts, each rotation shaft extending completely through a respective corresponding one of the plurality of oblong rectangular opaque blinds along a longitudinal axis thereof, each rotation shaft extending beyond the frame, wherein each of said plurality of oblong rectangular opaque blinds is rotatable around the longitudinal axis so as to define the area masked by the projection of each oblong rectangular opaque blind on the photosensitive medium and to continuously adjust a ratio between irradiated and non-irradiated areas on the photosensitive medium.

2. The apparatus of claim 1 wherein the longitudinal axis of each of said plurality of oblong rectangular opaque blinds passes through a center thereof and in parallel to a longitudinal edge of oblong rectangular opaque blind.

3. The apparatus of claim 1 wherein the plurality of oblong rectangular opaque blinds are each rotatable by a same angle at a same time, the angle varying from zero to ninety degrees.

4. The apparatus of claim 1 wherein each of said plurality of oblong rectangular opaque blinds is light absorbing.

5. In a lithography tool which is used to pattern integrated circuit devices on a semiconductor wafer, an apparatus for compensating light exposure on different, subsequently irradiated target areas in a photosensitive medium on a semiconductor wafer to improve an exposure dose uniformity comprising:

a mask filter with a plurality of rotatable oblong opaque elements positioned in a frame so that light passes through a region of the frame around an interior perimeter of the frame regardless of what angular position the rotatable oblong opaque elements are placed at, the rotatable oblong opaque elements being inserted between a light source and said photosensitive medium so that light selectively traverses through said plurality of rotatable oblong opaque elements to expose the photosensitive medium; and a plurality of rotation shafts, each rotation shaft extending completely through a respective corresponding one of the rotatable oblong opaque elements and exterior to the frame, wherein each of said plurality of rotatable oblong opaque elements is rotatable around a longitudinal axis so as to define the area masked by the projection of the opaque element on the photosensitive medium and to continuously adjust a ratio between irradiated and non-irradiated areas on the photosensitive medium.

6. The apparatus of claim 5 wherein the longitudinal axis of each of said plurality of rotatable oblong opaque elements passes through a center thereof and in parallel to a longitudinal edge of said rotatable oblong opaque element.

7. The apparatus of claim 5 wherein the longitudinal axis of each of said plurality of rotatable oblong opaque elements passes through a longitudinal edge of said rotatable oblong opaque element.

8. The apparatus of claim 5 wherein each of said plurality of rotatable oblong opaque elements is light absorbing.

* * * * *